United States Patent [19]
Tanabe et al.

[11] Patent Number: 4,906,209
[45] Date of Patent: Mar. 6, 1990

[54] FEED-THROUGH CAPACITOR HAVING A COMPLIANT PIN TERMINAL

[75] Inventors: Takeshi Tanabe; Takaaki Ooi; Shingo Okuyama, all of Nagaokakyo, Japan

[73] Assignee: Murata Manufacturing Co., Ltd., Kyoto, Japan

[21] Appl. No.: 271,339

[22] Filed: Nov. 9, 1988

Related U.S. Application Data

[62] Division of Ser. No. 103,457, Oct. 1, 1987, abandoned.

[51] Int. Cl.[4] .................... H01R 13/428; H01R 13/66
[52] U.S. Cl. ...................................... 439/620; 439/751
[58] Field of Search .................. 439/82, 751, 825–827, 439/873, 620; 333/181–185

[56] References Cited

U.S. PATENT DOCUMENTS

| | | | |
|---|---|---|---|
| 3,048,812 | 8/1962 | Heidler | 439/825 |
| 3,663,930 | 5/1972 | Henschen et al. | 439/631 |
| 4,066,326 | 1/1978 | Lovendusky | 439/873 |
| 4,186,982 | 2/1980 | Cobaugh et al. | 439/82 |
| 4,362,353 | 12/1982 | Cobaugh et al. | 439/825 |
| 4,519,665 | 5/1985 | Althouse et al. | 439/620 |
| 4,641,907 | 2/1987 | Althouse et al. | 439/620 |
| 4,641,910 | 2/1987 | Rozmus | 439/825 |
| 4,648,681 | 3/1987 | Pass et al. | 439/620 |

Primary Examiner—Gary F. Paumen
Attorney, Agent, or Firm—Wenderoth, Lind & Ponack

[57] ABSTRACT

A compliant pin terminal inserted into a through hole, such as a center hole of a feed-through capacitor or a through hole of a circuit substrate having an electrode at the inner periphery thereof, is mounted into the through hole for electrically connecting with the electrode therein. The pin terminal includes slits, by which linear divided portions and expanded elastic contact portions are formed so that when the body is inserted into the through hole of the capacitor the elastic contact portions come into press-contact with the electrode, thereby obtaining electrical connection with the electrode and mechanical locking by means of the elasticity of each elastic contact portion. A lengthwise pulling force acting on the terminal body is borne by the linear divided portions, but does not act on the elastic portions. Accordingly, an interval between the elastic contact portions opposite to each other resists change, thereby effectively preventing the pin terminal from escaping from the through hole.

1 Claim, 3 Drawing Sheets

FEED-THROUGH CAPACITOR HAVING A COMPLIANT PIN TERMINAL

This application is a division of now abandoned application Ser. No. 07/103,457 filed Oct. 1, 1987.

FIELD OF THE INVENTION

The present invention relates to a compliant pin terminal which is inserted into a through hole, such as a center hole in a feed-through capacitor or a through hole at a circuit substrate, having an electrode at the inner periphery, and electrically connects with the electrode.

BACKGROUND OF THE INVENTION

In a case where the pin terminal is packaged in the through hole at the circuit substrate so as to connect electrically with the electrode at the inner periphery, a compliant pin terminal 21 as exemplary in FIG. 11 may be used. The pin terminal 21 comprises a metallic terminal body 22, in which slits at an intermediate portion of the terminal body are expanded at the predetermined intervals so that two opposite divided portions 23 project outwardly to each other.

The pin terminal 21, when pressed into the through hole forming on the inner periphery thereof the electrode, is brought into press-contact at both the divided portions 23 with the inner surface of the through hole.

Hence, the pin terminal 21 is held in condition of being electrically connected to the through hole even without being soldered.

When such compliant pin terminal 21 is subjected to a lengthwise pulling force p, both the divided portions 23 are extended to make an interval ($L_2$ in the drawing) therebetween smaller than an inner diameter of the through hole.

Therefore, the pin terminal 21 does not come into press-contact with the through hole, thereby creating the problem in that the electrical connection is not obtained and the pin terminal escapes from the through hole.

For the above, as shown in FIG. 12, it has been proposed that the body 24 of compliant pin terminal is formed in an about C-like shape in section and press-contactable with the inner surface of the through hole throughout the entire length to thereby strengthen resistance of the pin terminal against the pulling force p.

Besides this, it has been proposed that the terminal body 24 is approximately S-like-shaped in section (refer to FIG. 13) or M-like-shaped in section (refer to FIG. 14).

The terminal body 24 of such section has no portion to be deformed by the pulling force, resulting in that its resistance is strengthened against the pulling force.

The compliant pin terminal of such construction, however, is of entirely uniform form as well as the portions in press-contact with the electrode at the inner periphery of the through hole, whereby when the pin terminal is deformed by the external force, the portions in press-contact with the inner electrode also are deformed, resulting in that there is a fear that the pin terminal cannot be connected and fixed reliably and stably to the electrode at the inner periphery of the through hole.

SUMMARY AND OBJECTS OF THE INVENTION

A first object of the present invention is to provide a compliant pin terminal which, even when subjected to a length-wise pulling force, can be prevented from escapting from a through hole at a circuit substrate or the like.

A second object of the present invention is to provide a compliant pin terminal simple in construction and inexpensive to produce.

A third object of the present invention is to provide a compliant pin terminal which, even when a portion thereof outside the through hole is subjected to the external force, can reliably and stably be connected and fixed to the electrode at the inner periphery of the through hole.

The above and other objects and features of the invention will appear more fully from the following description taken in connection with the accompanying drawings.

DETAILED DESCRIPTION OF THE INVENTION

Figure 1:
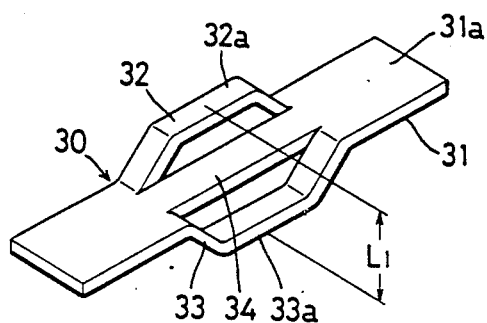
FIG. 1 is a perspective view of a first embodiment of a compliant pin terminal of the invention.

At first, in the first embodiment of the invention, a compliant pin terminal 30 is formed of a flat-plate-like-shaped terminal body 31 of metal, such as phosphor bronze, having elasticity, which is provided at an intermediate portion of the terminal body 31 with three divided portions 32, 33, and 34 divided by two lengthwise slits.

The central linear divided portion 34 is left as it is, and the divided portions 32 and 33 positioned outwardly thereof are plastically deformed to be expanded perpendicularly to the spreading surface 31a of the terminal body 31 and outwardly reversely or oppositely to each other, thereby forming elastic contact portions 32a and 33a respectively.

In addition, a distance ($L_1$ in FIG. 1) between the expanded elastic contact portions 32a and 33a is made slightly larger than an inner diameter of a through hole (not shown) into which the pin terminal 30 is fitted.

Thus, when such pin terminal 30 is press-fitted into the through hole provided in the inner surface with an electrode, the expanded elastic contact portions 32a and 33a at the pin terminal 30 are brought into press-contact with the inner surface of the through hole.

Hence, the pin terminal 30 is held in the through hole even without being soldered thereto, the pin terminal 30 and electrode formed at the through hole being thus electrically connected with each other.

Moreover, given that the elastic contact portions 32a and 33a in press-contact with the electrode at the inner periphery of the through hole are disposed only at a portion of the pin terminal 30 fitted into the through hole, even when the pin terminal 30 is subjected at its portion outside the through hole to an external force, the elastic contact portions 32a and 33a are not deformed, thereby enabling the pin terminal 30 to be connected and fixed reliably and stably to the through hole.

Figure 2:
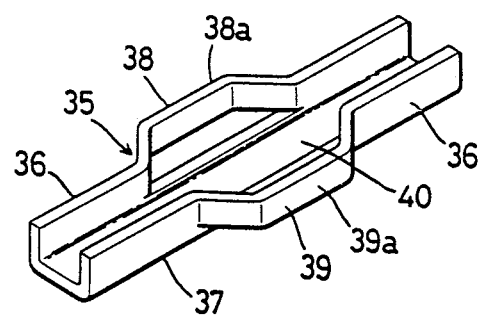
FIG. 2 is a perspective view of a second embodiment of the same.

Next, in FIG. 2 showing the second embodiment of the invention reference numeral 35 designates a compliant pin terminal.

The compliant pin terminal 35 comprises a terminal body 37 bent at both widthwise edges 36 in the same direction and molded to have a C-like shape in section.

At an intermediate portion of the terminal body 37 are formed divided portions 38, 39 and 40 divided by slits provided at the positions approximately coincident with the bending lines of both the edges 36, the divided portions 38 and 39 at both the edges 36 being plastically deformed to be expanded reversely or oppositely outwardly to each other, whereby the elastic contact portions 38a and 39a are formed.

In addition, the central divided portion 40 is flat and linear. The compliant pin terminal 35 is fitted into a through hole in the same manner as that of pin terminal 30 in the first embodiment, whereby its explanation is omitted herein.

In the above description, the present invention is applied to the compliant pin terminal as the simple component, and not confined thereto but applicable to a terminal of an electronic component.

Figure 3:
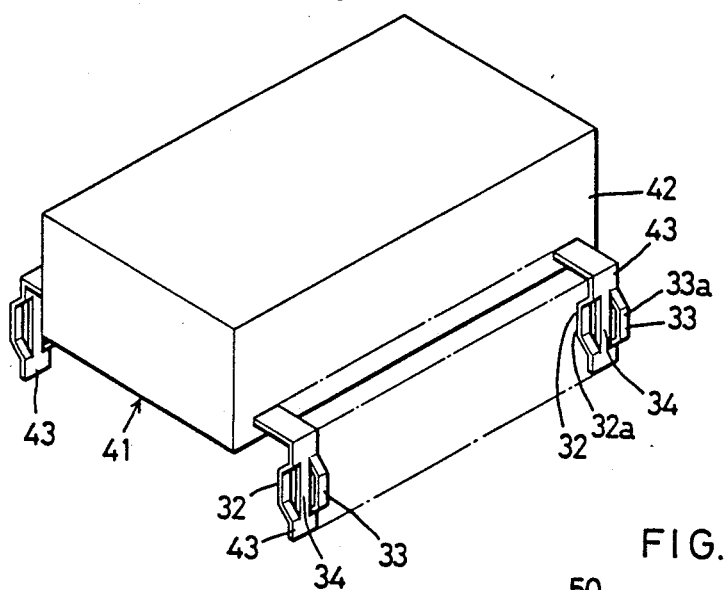
FIG. 3 is a perspective view of an electronic component applied with the first embodiment of the compliant pin terminal of the invention.

In FIG. 3 showing the first embodiment applied to an electronic component, a reference numeral 41 designates a DIP (dual-in-line package) type electronic component.

The electronic component 41 comprises an electronic component body 42 and lead terminals 43 for external connection, the lead terminals 43 being modified by the present invention.

In other words, each lead terminal 43 is provided at an intermediate portion thereof with divided portions 32, 33 and 34 formed the same as those at the compliant pin terminal 30 in the first embodiment.

Therefore, when the electronic component 41 is packaged onto a printed substrate, the lead terminals 43 need only be press-fitted directly into through holes provided at the printed substrate, whereby there is no need for the lead terminals to be soldered thereto.

Figure 4:
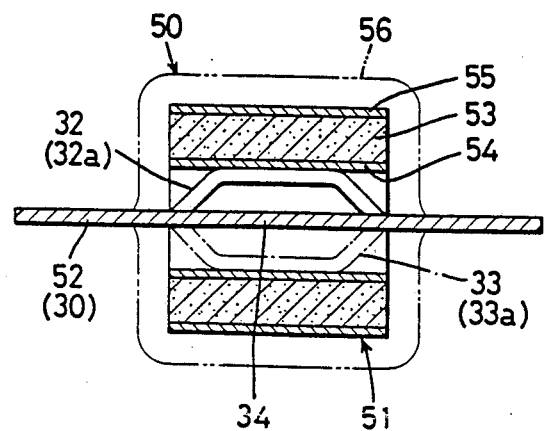
FIG. 4 is a longitudinal sectional view of a capacitor applied with the first embodiment of the same.

Also, the present invention is applicable to an electronic component, such as a feed-through capacitor, shown in longitudinal section in FIG. 4.

In FIG. 4, a reference numeral 50 designates a capacitor comprising an element assembly 51 and a central conductor 52.

The element assembly 51 is formed of a cylindrical dielectric of ceramic 53 having an inner electrode 54 at the inner surface and an outer electrode 55 at the outer surface, both the electrodes 54 and 55 sandwiching therebetween the dielectric of ceramic 53 to form the capacitor electrode.

In addition, the central conductor 52 is of the same construction as the compliant pin terminal 30 in the first embodiment.

When the pin terminal 52 as the central conductor is press-fitted into the element assembly 51, elastic contact portions 32a and 33a expanded from the conductor 52 come into press-contact with the inner periphery of the element assembly 51, thereby bringing the central conductor 52 into close-contact reliably with the inner electrode 54 at the element assembly 51.

In this case, it is preferable that the inner electrode 54 and central conductor 52 are applied with surface treatment, such as tin plating, for the contact.

Therefore, there is no need to connect by soldering the central conductor 52 with the inner electrode 54, whereby the inconvenience such as deterioration in the property of capacitor caused by the heat generated during the soldering is not created.

In addition, the capacitor 50, to which the central conductor 52 is mounted, is coated with a sheath material 56.

The above-mentioned electronic component is not confined to the capacitor, but may be of any other type when provided with a hole into which the conductor is to be fitted and with the electrode to connect therewith, for example, a chip type capacitor may be available which is formed in such a manner that in the capacitor in FIG. 4 the central conductor 52 is removed of both ends and attached with separate electrodes. Furthermore, the invention may be applicable to a pin terminal at a connector.

Figure 5:
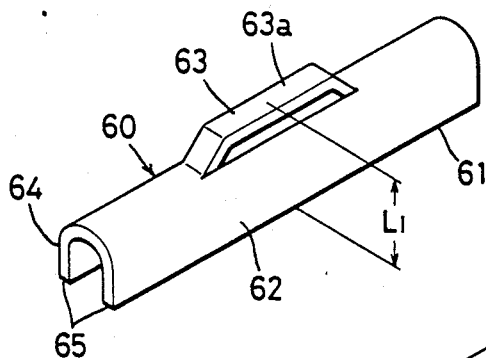
FIG. 5 is a perspective view of a third embodiment of the compliant pin terminal of the invention.
Figure 6:
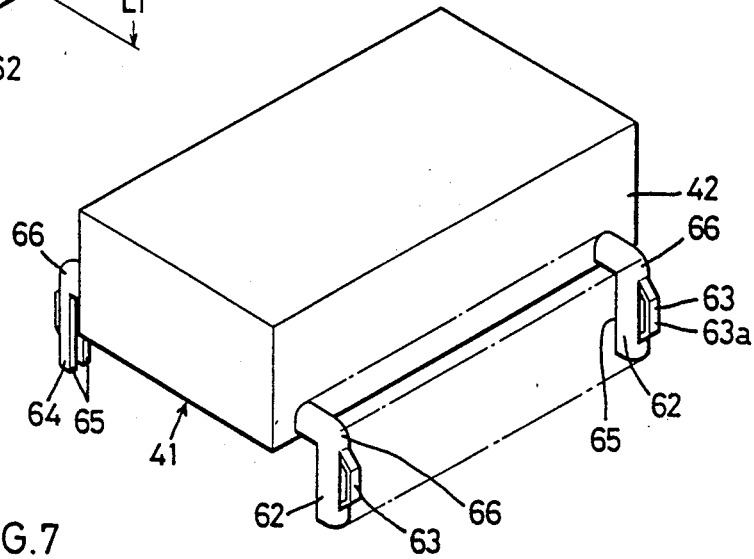
FIG. 6 is a perspective view of an electronic component applied with the third embodiment.
Figure 7:
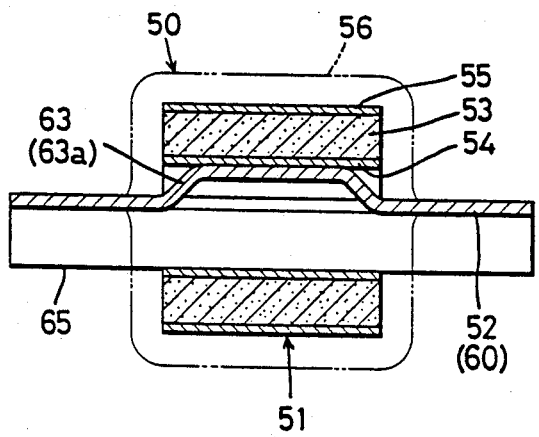
FIG. 7 is a longitudinal sectional view of a capacitor applied with the same.

Next, in FIGS. 5 through 7 showing the third embodiment, a compliant pin terminal 60 has a terminal body 61 of U-like or C-like shape in section.

The pin terminal body 61 is provided at a lengthwise intermediate portion thereof with three divided portions 62, 63, and 64 disposed widthwise of the terminal body 61 through two slits extending lengthwise thereof, the outside divided portions 62 and 64 being made flat and linear, the central divided portion 63 being expanded outwardly to form an elastic contact portion 63a.

In addition, a distance ($L_1$ in FIG. 5) between the outer surface of the expanded elastic contact portion 63a and each widthwise edge 65 of terminal body 61 opposite thereto is made slightly larger than an inner diameter of a through hold (not shown) into which the pin terminal 60 is fitted.

When such pin terminal 60 is press-fitted into the through hole in which the electrode is formed, the elastic contact portion 63a and the edges 65 at the pin terminal 60 are brought into press-contact with the inner surface of the through hole.

Hence, the pin terminal 60 is held within and against the through hole without being soldered thereto and also electrically connected with the electrode formed at the through hole.

In FIG. 6, the third embodiment of the pin terminal of the invention is applied to each terminal 66 of an electronic component 41, and in FIG. 7, the same is applied to an electronic component 50, such as a feed-through capacitor, in which the components are the same as those in FIGS. 3 and 4 are designated by the same reference numerals and require no detailed explanation.

Figure 8:
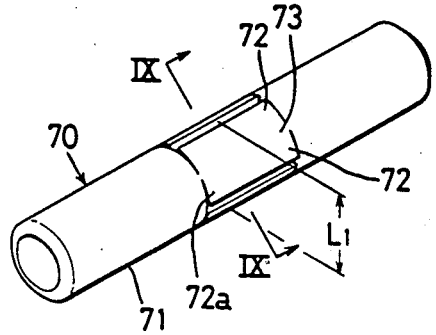
FIG. 8 is a perspective view of a fourth embodiment of a compliant pin terminal of the invention.
Figure 9:
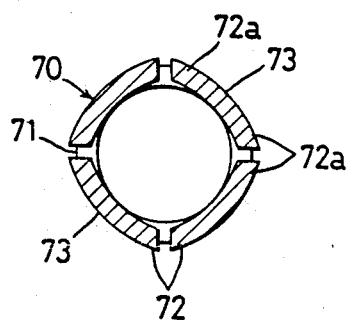
FIG. 9 is a sectional view taken on the line IX-IX in FIG. 8.

Next, in the fourth embodiment shown in FIGS. 8 and 9, a compliant pin terminal 70 has a cylindrical terminal body 71, which is provided at a lengthwise intermediate portion with four pairs of divided portions 72 formed in four slits of about H-like shape, circumferentially juxtaposed, and spaced each other by equal intervals.

The each pair of divided portions 72 project tangentially from the linear divided portion 73 therebetween, thereby forming elastic contact portions 72a.

In addition, a distance ($L_1$ in FIG. 8) between the upper surfaces of the elastic contact portions 72a opposite to each other with respect to the axis of the terminal body 71 is made slightly larger than an inner diameter of a through hole (not shown) into which the pin terminal 70 is held.

Figure 10:
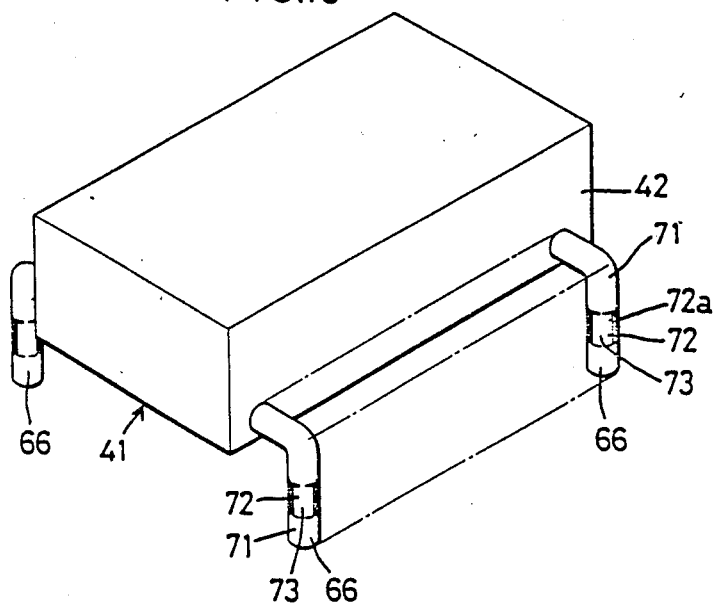
FIG. 10 is a perspective view of an electronic component applied with the fourth embodiment in FIG. 8.
Figure 11:
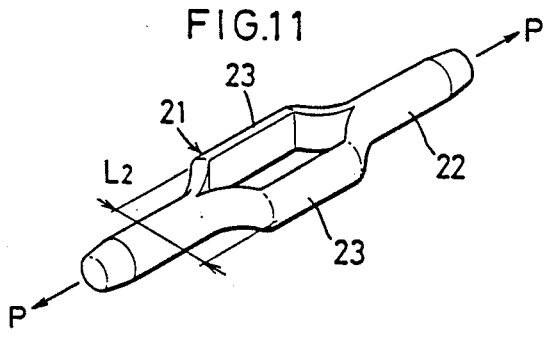
FIG. 11 is a perspective view of the conventional compliant pin terminal.
Figure 12:
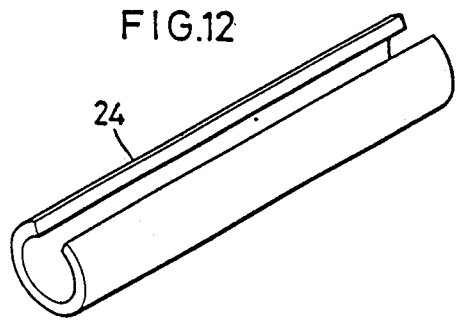
FIGS. 12 through 14 are perspective views exemplary of other conventional compliant pin terminals.
Figure 13:
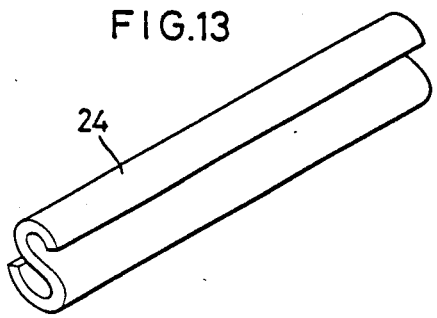
Figure 14:
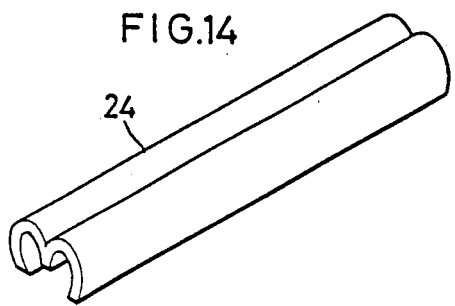

The fourth embodiment of the pin terminal is used in the same manner as the first through third embodiments. In FIG. 10, the pin terminal of the fourth embodiment is used in a DIP (dual-in-line package) type electronic component 41. In other words, the fourth embodiment of the compliant pin terminal of the invention is applied to each lead terminal 66 at the electronic component 41 comprising a body 42 thereof and the lead terminals 66.

In either case with the aforesaid embodiments, the compliant pin terminal inserted into the through hole is provided with the linear divided portions and expanded elastic contact portions formed by the slits provided in the terminal body, and the elastic portions coming into press-contact with the inner surface of the through hole, thereby holding the pin terminal therein.

Hence, even when a lengthwise pulling force acts on the compliant pin terminal held in the through hole, the linear divided portion bears the pulling force so that the expanded contact portions are not subjected thereto.

Accordingly, there is no fear that the distance between the opposite expanded elastic contact portions becomes smaller than an inner diameter of the through hole, whereby the compliant pin terminal is reliably prevented from escaping from the through hole.

Also, since the expanded elastic portions are formed only at the portion of pin terminal disposed within the through hole, even when the portion of the pin terminal outside the same is subjected to an external force, there is no fear that the elastic portions are deformed, thereby reliably and stably connecting and fixing the pin terminal within and against the through hole.

Furthermore, when the elastic contact portions are provided at a plurality of portions on the outer periphery of the cylindrical terminal body in the fourth embodiment, the terminal body is formed symmetrical in section and has no directional property, thereby being effective in that its deflection strength is uniform regardless of the direction of a shearing force acting transversely on the terminal body.

Although several embodiments have been described, they are merely exemplary of the invention and not to be constructed as limiting, the invention being defined solely by the appended claim.

We claim:

1. A feed-through capacitor comprising:
   a substantially cylindrical dielectric having an outer surface and an inner surface defining a through aperture;
   an inner electrode disposed on said inner surface of said cylindrical dielectric;
   an outer electrode disposed on said outer surface of said cylindrical dielectric;
   said inner electrode and said outer electrode sandwiching said cylindrical dielectric therebetween for defining a capacitor; and
   a flat plate-like central conductor disposed in said through aperture in said inner electrode, said central conductor having elastic contact means for releasably engaging said inner surface of said inner electrode, said elastic contact means of said central conductor including a flat main body and at least two contact portions integrally attached to said main body, a pair of slits being defined in said elastic contact means, a respective one of said pair of slits being between each one of said at least two contact portions and said main body for further defining each one of said at least two contact portions, and said at least two contact portions being bent and extending outwardly away from said main body and away from each other.

* * * * *